US012689362B2

(12) United States Patent
Poletto et al.

(10) Patent No.: US 12,689,362 B2
(45) **Date of Patent: \*Jul. 21, 2026**

(54) PULSE WIDTH MODULATION DECODER CIRCUIT, CORRESPONDING DEVICE AND METHODS OF OPERATION

(71) Applicant: STMicroelectronics S.r.l., Agrate Brianza (IT)

(72) Inventors: Vanni Poletto, Milan (IT); Ivan Floriani, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 147 days.

This patent is subject to a terminal disclaimer.

(21) Appl. No.: 18/643,249

(22) Filed: Apr. 23, 2024

(65) Prior Publication Data

US 2024/0275371 A1    Aug. 15, 2024

Related U.S. Application Data

(63) Continuation of application No. 17/556,495, filed on Dec. 20, 2021, now Pat. No. 11,996,851.

(30) Foreign Application Priority Data

Dec. 28, 2020    (IT) ........................ 102020000032504

(51) Int. Cl.
H03M 3/00        (2006.01)
H02M 1/096        (2006.01)
(Continued)

(52) U.S. Cl.
CPC .............. H03K 9/08 (2013.01); H02M 1/096 (2013.01); H02M 3/156 (2013.01)

(58) Field of Classification Search
CPC ........... H03K 9/08; H03K 7/08; H02M 1/096; H02M 3/156; H03M 1/504
(Continued)

(56) References Cited

U.S. PATENT DOCUMENTS 9,425,781 B2    8/2016  Nandy et al.
9,559,583 B2 *  1/2017  Lin ........................ H02M 3/156
(Continued)

FOREIGN PATENT DOCUMENTS

CA            913189 A    10/1972
CN        106951385 A    7/2017

OTHER PUBLICATIONS

CN First Office Action and Search Report for counterpart CN Appl. No. 202111615482.8, report dated Aug. 14, 2025, 11 pgs.
(Continued)

*Primary Examiner* — Jean B Jeanglaude
(74) *Attorney, Agent, or Firm* — Crowe & Dunlevy LLC

(57)        ABSTRACT

A circuit for decoding a pulse width modulated (PWM) signal generates an output signal switching between a first and second logic values as a function of a duty-cycle of the PWM signal. Current generating circuitry receives the PWM signal and injects a current to and sinks a current from an intermediate node as a function of the values of the PWM signal. A capacitor coupled to the intermediate node is alternatively charged and discharged by the injected and sunk currents, respectively, to generate a voltage. A comparator circuit coupled to the intermediate node compares the generated voltage to a comparison voltage and drives the logic values of the output signal as a function of the comparison.

16 Claims, 6 Drawing Sheets

(51) Int. Cl.
  *H02M 3/156* (2006.01)
  *H03K 9/08* (2006.01)

(58) Field of Classification Search
  USPC .......................................................... 341/143
  See application file for complete search history.

(56) References Cited

U.S. PATENT DOCUMENTS

| | | | |
|---|---|---|---|
| 10,958,261 B2 * | 3/2021 | Li | ......................... H02M 1/096 |
| 2007/0075790 A1 | 4/2007 | Liao | |
| 2015/0061628 A1 | 3/2015 | Nguyen et al. | |
| 2015/0200608 A1 | 7/2015 | Lin et al. | |
| 2019/0132163 A1 | 5/2019 | Ray | |
| 2020/0099373 A1 | 3/2020 | Li et al. | |

OTHER PUBLICATIONS

IT Search Report and Written Opinion for priority application, IT 102020000032504, report dated Sep. 10, 2021, 9 pages.

Texas Instruments: Digital Isolator Design Guide, Developer's Guide, SLLA284A, Jan. 2009, Revised Nov. 2014, 19 pages.

De Haas, Clemens, et al: "CAN XL Symmetry and Mode Switching," NXP Secure Connections for a Smarter World, Feb. 2020, 29 pages.

\* cited by examiner

FIG. 1A                        FIG. 1B
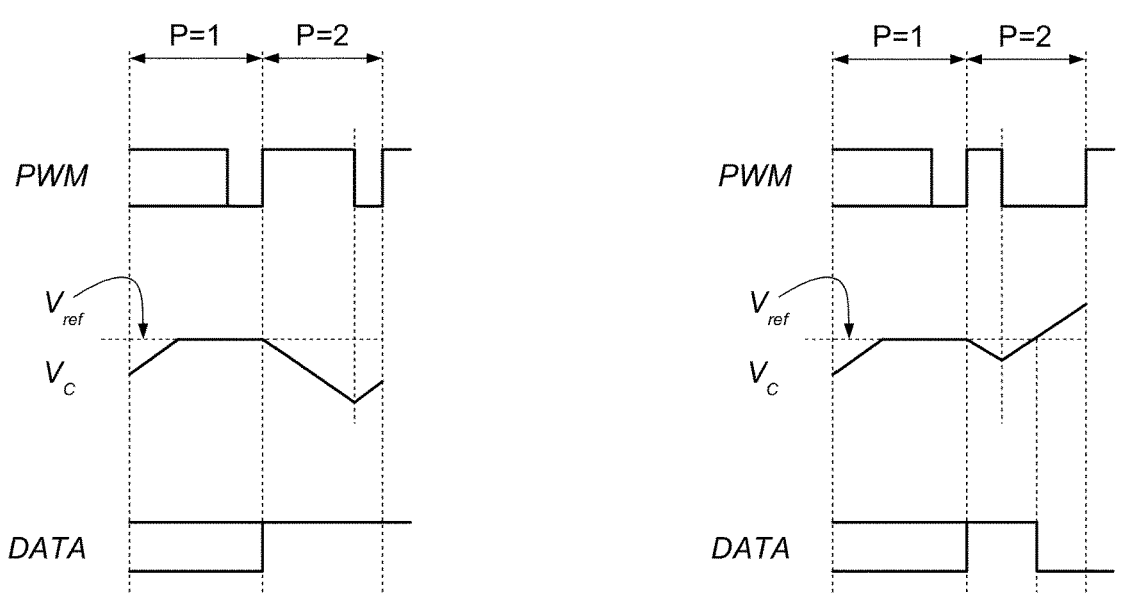
FIG. 2A
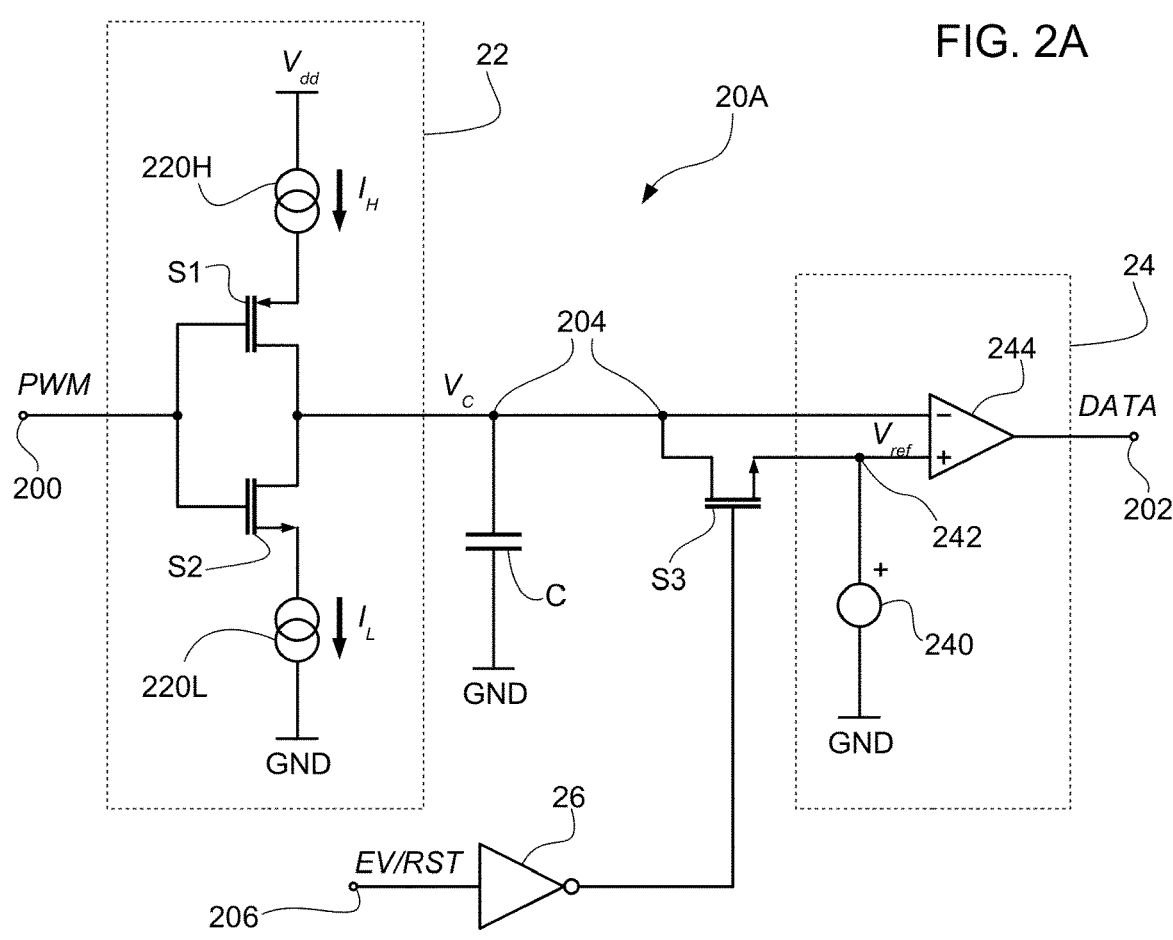

PULSE WIDTH MODULATION DECODER CIRCUIT, CORRESPONDING DEVICE AND METHODS OF OPERATION

CROSS REFERENCE TO RELATED APPLICATIONS

This application is a continuation of U.S. patent application Ser. No. 17/556,495, filed Dec. 20, 2021, which claims the priority benefit of Italian Application for Patent No. 10202000032504, filed on Dec. 28, 2020, the contents of which are hereby incorporated by reference in their entireties to the maximum extent allowable by law.

TECHNICAL FIELD

The description relates to pulse width modulation (PWM) decoder circuits.

For instance, a PWM decoder circuit according to one or more embodiments may be applied in a transceiver circuit for use in a Controller Area Network (CAN) bus, or in a driver circuit for driving a silicon carbide (SiC) power stage.

BACKGROUND

Pulse width modulation (PWM) is a type of digital signal modulation which allows for generating a signal having an average voltage value variable over time. For each unit of time (i.e., for each period of the PWM signal), such average voltage value depends on the ratio between the length or duration of a positive pulse, and the length or duration of a subsequent negative pulse. The ratio between the duration of a positive pulse and the duration of the whole PWM period is notionally referred to as the duty-cycle of the PWM signal.

The PWM modulation may be used in those communication protocols where information is encoded as a function of the time duration of each pulse of the digital signal.

A Controller Area Network (CAN) bus is a robust vehicle bus standard designed to allow the devices coupled to the bus to communicate amongst themselves. Each device coupled to the bus may transmit data sequentially in a CAN frame, in such a way that if more than one device transmits at the same time, the device having the higher priority is able to continue the transmission while the other devices will discontinue the transmission. Frames exchanged in a CAN bus are received by all the devices coupled to the bus, including the transmitting device.

CAN XL is a new standard that is currently under development by the CAN in Automation (CiA) association, with the goal of extending the features of the CAN FD standard to handle larger files. The CAN XL standard is designed to provide net data rates as high as 10 Mbit/s, while maintaining the advantages of the CAN protocol and the interoperability with the standards CAN and CAN FD.

It has been proposed to use the PWM modulation to encode digital information in a CAN XL protocol. Each period of a PWM signal transmitted on a CAN bus may encode a bit of information: for instance, the duty-cycle being equal to a first value (e.g., 25%) may encode a first binary value (e.g., "0"), and the duty-cycle being equal to a second value (e.g., 75%) may encode a second binary value (e.g., "1").

Use of a PWM modulation in a CAN protocol may be advantageous insofar as PWM encoding may be easier to decode than other encoding techniques (e.g., easier to decode than a Manchester encoding). In order to decode a PWM signal, it may be sufficient to detect the duration of the high pulse, detect the duration of the time interval between two consecutive rising edges, compare the first duration to the second duration to compute a value of duty-cycle, and associate a "data zero" or "data one" binary value to the received PWM period as a function of the computed duty-cycle.

In particular, it has been proposed to operate a CAN XL bus by switching operation between a high speed communication mode relying on PWM modulation, and a normal speed communication mode relying on a conventional Non Return to Zero (NRZ) modulation. For instance, a device coupled to a CAN XL bus may comprise a microcontroller and a CAN transceiver; the microcontroller may communicate to the transceiver, via a single TXD connection, a set of data bits (1 or 0) to be transmitted via the CAN bus, as well as a flag indicating whether transmission is to be carried out at a high speed with PWM modulation, or at a lower speed with NRZ modulation.

Another field where the PWM modulation may be applied is that of insulated driver circuits, e.g., for driving silicon carbide (SiC) power elements such as a half-bridge arrangement comprising a pair of SiC transistors. Document "UCC20225 2.5-kV$_{RMS}$ Isolated Dual-Channel Gate Driver with Single Input in LGA", SLUSCV8A—April 2017—Revised February 2018 by Texas Instrument, incorporated herein by reference, is exemplary of such field of application.

Silicon carbide power elements are usually biased at a high voltage (HV), while the (logic) driving circuitry is usually biased at a low voltage (LV). Galvanic isolation (e.g., capacitive isolation) between the low voltage circuit section and the high voltage circuit section may be required for safety reasons. Also, a continuous confirmation of command signals exchanged through the capacitive isolation barrier may be needed to provide improved robustness against noise. However, DC communication through the capacitive isolation barrier is not possible, and a modulation of the communication signals is needed.

Using a PWM modulation is a suitable choice in the context of insulated driver circuits described above. However, a fast time response is a desirable feature for SiC driver circuits. For instance, the total communication delay of a communication channel for a SiC driver circuit may preferably be lower than 50 ns. The delay budget allocated for both modulation and demodulation of the PWM signal may be in the order of about 10 ns. Therefore, the time period of one PWM cycle may be in the order of about 10 ns/2=5 ns.

Conventional PWM decoder circuits known in the art may not be able to correctly decode PWM signals having a period as short as 5 ns (i.e., a frequency of 200 MHz). Certain PWM decoder circuits known in the art comprise a first, low frequency decoding channel and a second, high frequency decoding channel. Document "Digital Isolator Design Guide", SLLA284A—January 2009—Revised November 2014 by Texas Instrument, incorporated herein by reference, is exemplary of such prior art.

The low frequency channel is suitable for low speed or DC signals, but may not be sufficiently fast (e.g., it may not satisfy the requirement of a maximum delay time equal to 50 ns). The high frequency channel is suitable for high speed signals, but may not be sufficiently reliable against noise at low speed or DC signals. Additionally, such an approach may be expensive insofar as it requires a double PWM communication channel.

It is noted that, both for use in CAN transceivers and for use in isolated driver circuits, as well as for use in other applications not considered herein for the sake of brevity only, there is a need in the art to provide PWM decoder circuits able to decode high-frequency PWM signals. For instance, there is a need in the art to provide a PWM decoder circuit having a single PWM communication channel with wide frequency response (e.g., from DC to 150 Mbit/s).

SUMMARY

One or more embodiments may relate to a circuit (e.g., a "two-cycle" pulse width modulation (PWM) decoder circuit).

One or more embodiments may relate to a corresponding device (e.g., an electronic device comprising a pair of PWM decoder circuits to provide a "one-cycle" PWM decoder).

One or more embodiments may relate to corresponding methods of operating the circuit and the device.

A circuit according to one or more embodiments may comprise an input node configured to receive an input pulse width modulated signal switching between a first input value and a second input value, and an output node configured to provide an output signal switching between a first output value and a second output value as a function of the duty-cycle of the input signal. The circuit may comprise current generating circuitry coupled between a supply voltage node and a ground voltage node. The current generating circuitry may be coupled to the input node to receive the input signal and may be coupled to an intermediate node of the circuit to inject a current therein or to sink a current therefrom as a function of the value of the input signal. The circuit may comprise a capacitance having a first terminal coupled to the intermediate node, the capacitance being alternatively charged and discharged by the currents generated by the current generating circuitry. The circuit may comprise a comparator circuit coupled between the intermediate node and the output node; the comparator circuit may be configured to sense a voltage signal at the intermediate node, compare the sensed voltage signal to a reference (e.g., threshold) voltage signal, and drive the output node to the first output value or to the second output value as a function of the comparison to generate the output signal.

Therefore, one or more embodiments may provide a PWM decoder circuit which is adapted to decode PWM signals at a high frequency.

BRIEF DESCRIPTION OF THE DRAWINGS

One or more embodiments will now be described, by way of example only, with reference to the annexed figures, wherein:

FIGS. 1A and 1B are time diagrams of signals in a pulse width modulation (PWM) decoder circuit according to one or more embodiments of the present description, FIG. 2A is a circuit block diagram exemplary of a PWM decoder circuit according to an embodiment of the present description.

DETAILED DESCRIPTION

Figure 2B:
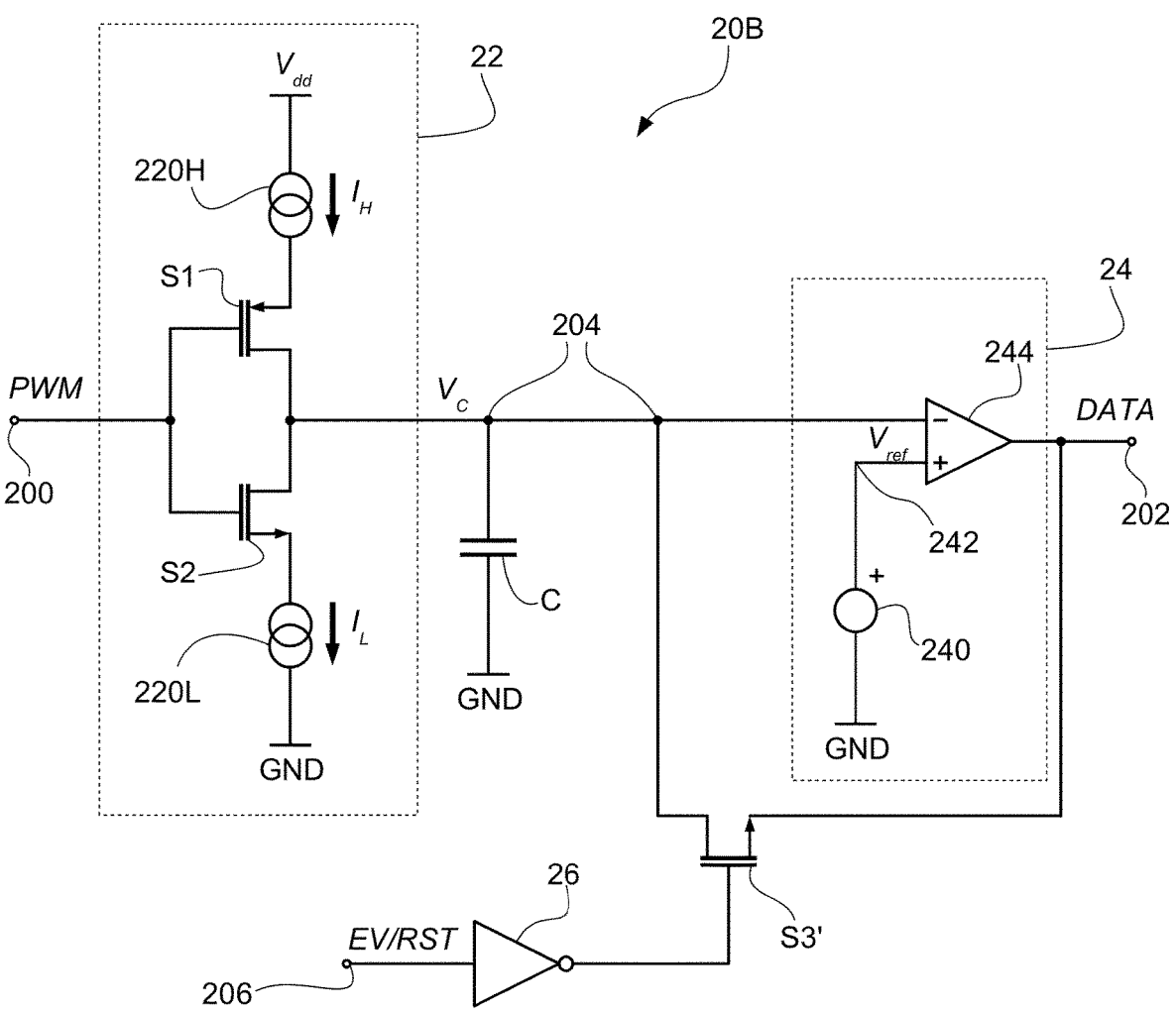
FIG. 2B is a circuit block diagram exemplary of a PWM decoder circuit according to another embodiment of the present description.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, unless the context indicates otherwise, like parts or elements are indicated with like references/numerals and a corresponding description will not be repeated for brevity.

The headings/references used herein are provided merely for convenience and hence do not define the extent of protection or the scope of the embodiments.

One or more embodiments of the instant disclosure relate to a pulse width modulation (PWM) decoder circuit. A PWM decoder circuit receives an input PWM signal and provides an output data signal which indicates, as a function of the duty-cycle of each period of the PWM signal, whether that period carries a logical zero or a logical one. For instance, a duty-cycle higher than a certain threshold may be indicative of a logical one, and a duty-cycle lower than that threshold may be indicative of a logical zero. Optionally, the threshold may be set to 50%, but other values may be possible.

FIGS. 1A and 1B are time diagrams of signals which exemplify the working principle of one or more embodiments. In particular, FIGS. 1A and 1B exemplify the time behavior of an input signal PWM, an intermediate signal $V_C$ (generated inside the PWM decoder circuit), and the corresponding output signal DATA in two different cases.

In FIGS. 1A and 1B, there is illustrated a first PWM period (P=1) during which the intermediate signal $V_C$ is reset to a reference value $V_{ref}$. During the reset phase, the value of the input signal PWM does not have an impact on the behavior of the intermediate signal $V_C$ (this is a "don't care" condition exemplified by the co-existing high and low values of signal PWM), and the output signal DATA is consequently invalid (the invalid condition exemplified by the co-existing high and low values of signal DATA). During a second PWM period (P=2) which follows the reset phase, the intermediate signal $V_C$ decreases at a controlled rate while the input signal PWM is high, and it increases at a controlled rate (e.g., the same as the decrease rate) while the input signal PWM is low. Therefore, the value of the intermediate signal $V_C$ at the end of the second PWM period is indicative of the duty-cycle of the PWM signal during that period. The output signal DATA is generated by comparing the intermediate signal $V_C$ to the reference value $V_{ref}$. If the intermediate signal $V_C$ is lower than the reference value $V_{ref}$, then the output signal DATA is high; if the intermediate signal $V_C$ is higher than the reference value $V_{ref}$, then the output signal DATA is low. As a result, sampling of the output signal DATA at the end of the PWM cycle allows to decode the information carried by the corresponding PWM period. For instance, in FIG. 1A the duty-cycle of the second PWM period is high, thus DATA=1 at the end of the period; conversely, in FIG. 1B the duty-cycle of the second PWM period is low, thus DATA=0 at the end of the period.

FIG. 2A is a circuit block diagram exemplary of an embodiment of a PWM decoder circuit 20A operating as discussed with reference to FIGS. 1A and 1B.

As exemplified in FIG. 2A, the PWM decoder circuit 20A comprises an input node 200 configured to receive an input pulse width modulated signal PWM, and an output node 202 configured to provide an output signal DATA. The input signal PWM switches between a first value (e.g., high) and a second value (e.g., low) with a constant period and a variable duty-cycle to encode a bit of information in each PWM period. The output signal DATA switches between a respective first value (e.g., high) and a respective second value (e.g., low) as a function of the duty-cycle of the input signal PWM to provide the decoded binary information. For instance, the output signal DATA may be low to indicate a short duty-cycle of the PWM signal, encoding a logic zero, and may be high to indicate a long duty-cycle of the PWM signal, encoding a logic one.

The PWM decoder circuit 20A comprises current generating circuitry 22 coupled between a supply voltage node $V_{dd}$ and a ground voltage node GND. The current generating circuitry 22 is coupled to the input node 200 to receive the input signal PWM, and it is coupled to an intermediate node 204 of the circuit 20A. The current generating circuitry 22 is configured to inject a current into the intermediate node 204 or to sink a current from the intermediate node 204 as a function of the value of the input signal PWM. As exemplified herein, a current may be injected into node 204 while PWM=0, and a current may be sunk from node 204 while PWM=1.

The PWM decoder circuit 20A comprises a capacitance C (e.g., a capacitor) having a first terminal coupled to the intermediate node 204. The second terminal of the capacitance C may be coupled to the ground voltage node GND, so that the capacitance C is alternatively charged (e.g., while PWM=0) and discharged (e.g., while PWM=1) by the currents generated by the current generating circuitry 22.

The PWM decoder circuit 20A comprises a comparator circuit 24 coupled between the intermediate node 204 and the output node 202. As exemplified herein, the comparator circuit 24 is configured to sense a voltage signal $V_C$ at the intermediate node 204, compare the voltage signal $V_C$ to a reference voltage signal $V_{ref}$, and drive the output node 202 to a first value (e.g., high) or to a second value (e.g., low) as a function of the comparison between signals $V_C$ and $V_{ref}$.

The current generating circuitry 22 may comprise a first electronic switch S1 (e.g., a transistor such as a MOS transistor) coupled between the supply voltage node $V_{dd}$ and the intermediate node 204 and a second electronic switch S2 (e.g., a transistor such as a MOS transistor) coupled between the intermediate node 204 and the ground voltage node GND. The first switch S1 may be controlled to be conductive when the input signal PWM assumes the second value (e.g., low), and second switch S2 may be controlled to be conductive when the input signal PWM assumes the first value (e.g., high). For instance, the first switch S1 may comprise a p-type MOS transistor and the second switch S2 may comprise an n-type MOS transistor, so that the switch S1 is conductive when PWM=0 and the switch S2 is conductive when PWM=1.

The current generating circuitry 22 may comprise a current generator 220H coupled in series to the switch S1 to inject a current $I_H$ into the intermediate node 204 when the switch S1 is conductive. For instance, the current generator 220H may be coupled between the supply voltage node $V_{dd}$ and the switch S1 as exemplified in FIG. 2A, or it may be coupled between the switch S1 and the intermediate node 204.

Similarly, the current generating circuitry 22 may comprise a current generator 220L coupled in series to the switch S2 to sink a current $I_L$ from the intermediate node 204 when the switch S2 is conductive. For instance, the current generator 220L may be coupled between the switch S2 and the ground voltage node GND as exemplified in FIG. 2A, or it may be coupled between the intermediate node 204 and the switch S2.

As exemplified in FIG. 2A, the PWM decoder circuit 20A may comprise voltage generating circuitry configured to generate the reference voltage value $V_{ref}$ for comparison with the intermediate signal $V_C$. For instance, the comparator circuit 24 may comprise a voltage generator 240 coupled between the ground voltage node GND and a reference voltage node 242 to provide the reference voltage value $V_{ref}$ thereto.

As exemplified in FIG. 2A, the comparator circuit 24 may comprise an amplifier circuit 244 (e.g., an operational amplifier or op-amp) having a first input coupled to the intermediate node 204 to sense the voltage signal $V_C$, a second input coupled to the reference voltage node 242 to sense the reference voltage value $V_{ref}$, and an output coupled to the output node 202 to provide the output signal DATA thereto. For instance, an inverting input of the amplifier 244 may be coupled to the intermediate node 204 and a non-inverting input of the amplifier 244 may be coupled to the reference voltage node 242, so that the output signal DATA is forced to a low value when $V_C > V_{ref}$, and to a high value when $V_C < V_{ref}$.

As exemplified in FIG. 2A, the PWM decoder circuit 20A may comprise an input control node 206 configured to receive a control signal EV/RST. The control signal EV/RST may switch between a first value (e.g., high) which brings the PWM decoder circuit into a "duty-cycle evaluation phase", and a second value (e.g., low) which brings the PWM decoder circuit into a "capacitance reset phase". During the duty-cycle evaluation phase, the voltage at the intermediate node 204 should be determined by the voltage across the capacitance C as a function of its state of charge (i.e., as a function of the input signal PWM). During the reset phase, instead, the voltage at the intermediate node 204 should be brought to a reference value so as to reset the amount of charge stored into the capacitance C to a predetermined value which is the "starting point" for a subsequent duty-cycle evaluation phase.

Therefore, as exemplified in FIG. 2A, the PWM decoder circuit 20A may comprise an electronic switch S3 coupled between the intermediate node 204 and the reference voltage node 242 and controlled by the control signal EV/RST in such a way that the switch S3 couples the intermediate node 204 to the reference voltage node 242 (i.e., it becomes conductive) when the control signal EV/RST has the second value (e.g., low), and decouples the intermediate node 204 from the reference voltage node 242 (i.e., it becomes non-conductive) when the control signal EV/RST has the first value (e.g., high).

For instance, the switch S3 may comprise a transistor such as a MOS transistor; in the case exemplified herein, the switch S3 is an n-type MOS transistor having a gate terminal coupled at the output of an inverter 26. The inverter 26 has its input coupled to the control input 206, and provides at its output an inverted replica of the control signal EV/RST.

Those of skill in the art will understand that a PWM decoder circuit 20A as exemplified in FIG. 2A operates according to the operating principle discussed with reference to FIGS. 1A and 1B. Such PWM decoder circuit may be referred to as a "two-cycle PWM decoder" since it may be used to decode the information carried by every second PWM period of the input signal PWM, insofar as a reset phase needs to be actuated after each duty-cycle evaluation.

Advantageously over the known solutions, the PWM decoder circuit 20A exemplified in FIG. 2A relies on the use of a single capacitor C with two currents (charge $I_H$, discharge $I_L$), instead of using two capacitors with two charge currents. Therefore, a single voltage $V_C$ on the capacitor C can be compared to a reference voltage $V_{ref}$, rather than using a double input comparator for two separate capacitors, and the simple fixed input threshold comparator 244 can operate faster.

It is noted that, in a PWM decoder circuit 20A as exemplified in FIG. 2A, the accuracy of operation may depend on the matching of the current sources 220H and 220L, on the offset of the differential comparator 244, and on the speed of the differential comparator 244. The accuracy of operation may be independent from any matching issue of capacitors, insofar as a single capacitor is used.

FIG. 2B is a circuit block diagram exemplary of another embodiment of a PWM decoder circuit 20B operating as discussed with reference to FIGS. 1A and 1B. As anticipated, parts or elements already disclosed with reference to the circuit 20A of FIG. 2A are indicated with like references/numerals. In particular, the embodiment of FIG. 2B will be described mainly by indicating the differences with respect to the embodiment of FIG. 2A, while avoiding unnecessary repetitions for the sake of brevity only.

As exemplified in FIG. 2B, switching of the PWM decoder circuit 20B between the "duty-cycle evaluation phase" and the "capacitance reset phase" may be obtained by a switch S3' coupled between the intermediate node 204 and the output node 202 and controlled by the control signal EV/RST in such a way that the switch S3' couples the intermediate node 204 to the output node 202 (i.e., it becomes conductive) when the control signal EV/RST has the second value (e.g., low), and decouples the intermediate node 204 from the output node 202 (i.e., it becomes non-conductive) when the control signal EV/RST has the first value (e.g., high). For instance, the switch S3' may comprise a transistor such as a MOS transistor; in the case exemplified herein, the switch S3' is an n-type MOS transistor having a gate terminal coupled at the output of the inverter 26.

Advantageously, in the PWM decoder circuit 20B exemplified in FIG. 2B, a simple fixed input threshold comparator 244 can drive the capacitor C in a closed loop configuration, thereby cancelling the input offset voltage.

Therefore, in a PWM decoder circuit 20B as exemplified in FIG. 2B, the accuracy of operation may depend on the matching of the current sources 220H and 220L and on the speed of the differential comparator 244. The accuracy of operation may be independent from any matching issue of capacitors, insofar as a single capacitor is used, and from the offset of the differential comparator 244, insofar as it gets cancelled during the "reset phase".

Figure 2C:
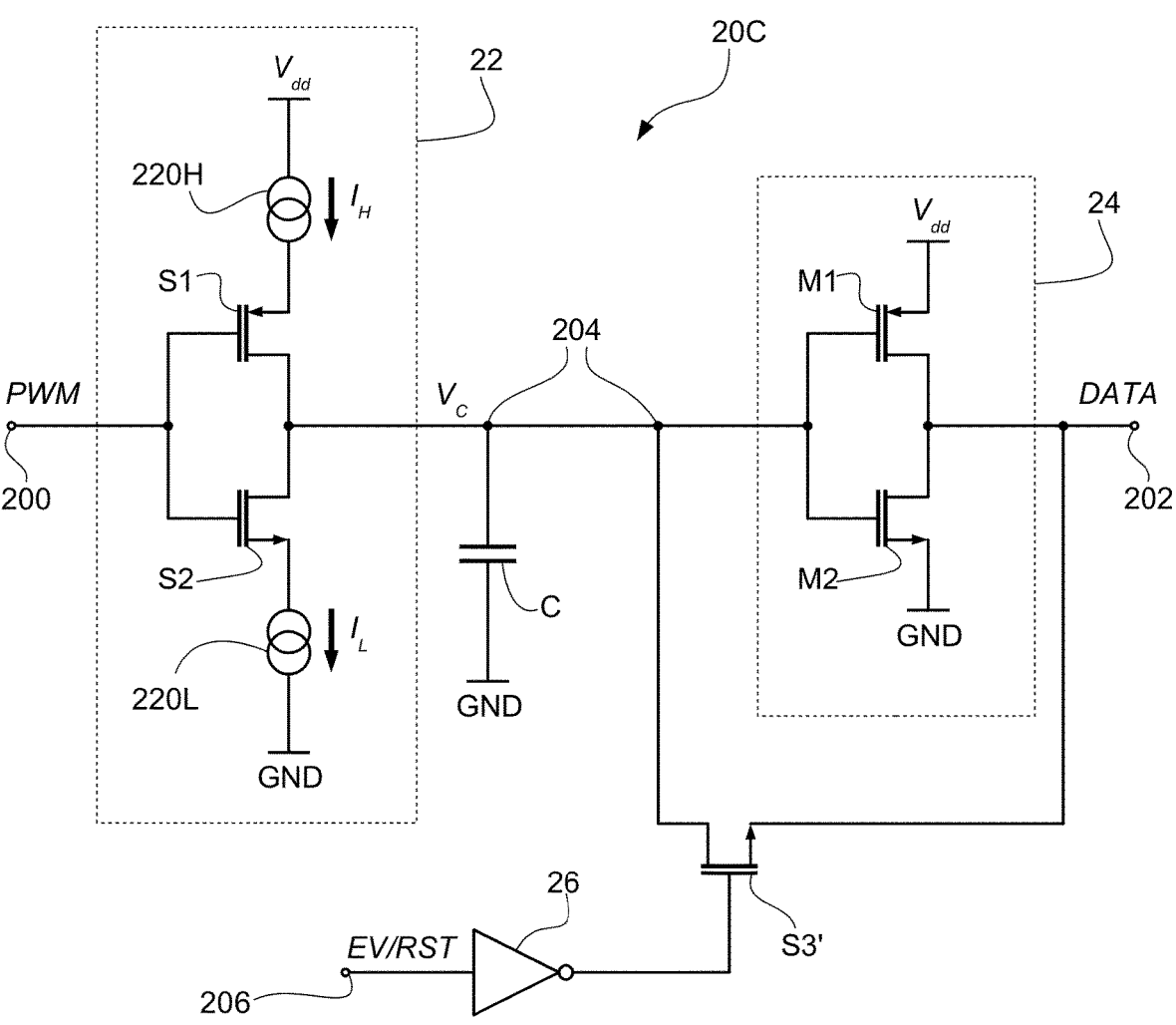
FIG. 2C is a circuit block diagram exemplary of a PWM decoder circuit according to another embodiment of the present description.

FIG. 2C is a circuit block diagram exemplary of another embodiment of a PWM decoder circuit 20C operating as discussed with reference to FIGS. 1A and 1B. As anticipated, parts or elements already disclosed with reference to the circuits 20A, 20B of FIGS. 2A, 2B are indicated with like references/numerals. In particular, the embodiment of FIG. 2C will be described mainly by indicating the differences with respect to the embodiment of FIG. 2B, while avoiding unnecessary repetitions for the sake of brevity only.

As exemplified in FIG. 2C, the comparator circuit 24 of a PWM decoder circuit 20C may comprise an inverter arrangement coupled between the intermediate node 204 and the output node 202. The inverter arrangement includes a first transistor M1 (e.g., a p-type MOS transistor) having a current path coupled between the supply voltage node $V_{dd}$ and the output node 202, and a second transistor M2 (e.g., an n-type MOS transistor) having a current path coupled between the output node 202 and the ground voltage node GND. The control nodes (e.g., gate terminals) of the transistors M1 and M2 are coupled to the intermediate node 204, in such a way that the conductivity of the transistors M1 and M2 is controlled by the value of the signal $V_C$.

By resorting to such an inverter arrangement, the voltage signal $V_C$ at the intermediate node 204 is compared to a reference voltage $V_{ref}$ which is approximately equal to half of the supply voltage $V_{dd}$ (i.e., $V_{ref} \approx V_{dd}/2$) to generate the output signal DATA: the output signal DATA is forced to a low value when $V_C > V_{dd}/2$, and to a high value when $V_C < V_{dd}/2$.

Advantageously, the PWM decoder circuit 20C exemplified in FIG. 2C may operate a faster comparison between the signal $V_C$ and the reference value $V_{ref}$ than other solutions relying, for instance, on the use of an amplifier circuit as comparator.

In a PWM decoder circuit 20C as exemplified in FIG. 2C, the accuracy of operation may depend on the matching of the current sources 220H and 220L and on the (high) speed of the inverter comparator M1, M2. The accuracy of operation may be independent from any matching issue of capacitors, insofar as a single capacitor is used, and from the offset of the inverter comparator M1, M2, insofar as it gets cancelled during the "reset phase".

Figure 2D:
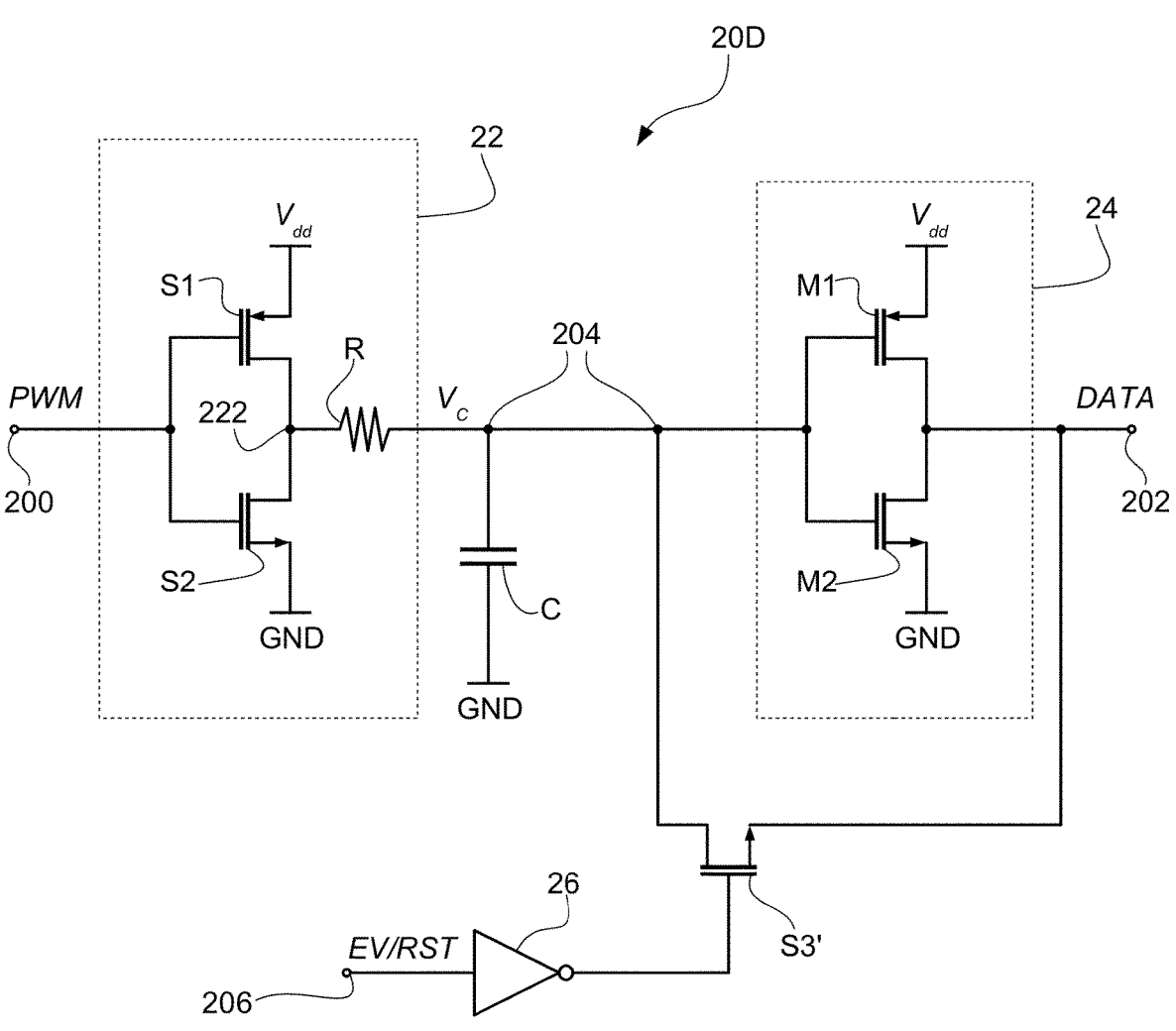
FIG. 2D is a circuit block diagram exemplary of a PWM decoder circuit according to another embodiment of the present description.

FIG. 2D is a circuit block diagram exemplary of another embodiment of a PWM decoder circuit 20D operating as discussed with reference to FIGS. 1A and 1B. As anticipated, parts or elements already disclosed with reference to the circuits 20A, 20B, 20C of FIGS. 2A, 2B, 2C are indicated with like references/numerals. In particular, the embodiment of FIG. 2D will be described mainly by indicating the differences with respect to the embodiment of FIG. 2C, while avoiding unnecessary repetitions for the sake of brevity only.

As exemplified in FIG. 2D, the current generating circuitry 22 of a PWM decoder circuit 20D may comprise, in the place of the current generators 220H and 220L, a resistance R (e.g., a resistor) coupled between a common terminal of the switches S1 and S2, and the intermediate node 204. As exemplified in FIG. 2D, in case the switches S1 and S2 are implemented with a p-MOS transistor and an n-MOS transistor, respectively, the common node of the transistors S1 and S2 may be the node coupling the drain terminals of transistors S1 and S2.

Advantageously, in the PWM decoder circuit 20D exemplified in FIG. 2D, the charge/discharge current(s) for charging/discharging the capacitance C may be activated more rapidly than in other solutions.

In a PWM decoder circuit 20D as exemplified in FIG. 2D, the accuracy of operation may depend on the offset of the inverter comparator M1, M2 (since the charge/discharge currents of the capacitance C are identical only if the reset value of the voltage $V_C$ is precisely equal to $V_{dd}/2$) and on the (high) speed of the inverter comparator M1, M2. Advantageously, the accuracy of operation may be independent from any matching issue of the current sources and any matching issue of capacitors, insofar as a single resistor R is used as current source (in combination with switches S1, S2) and a single capacitor C is used.

Figure 2E:
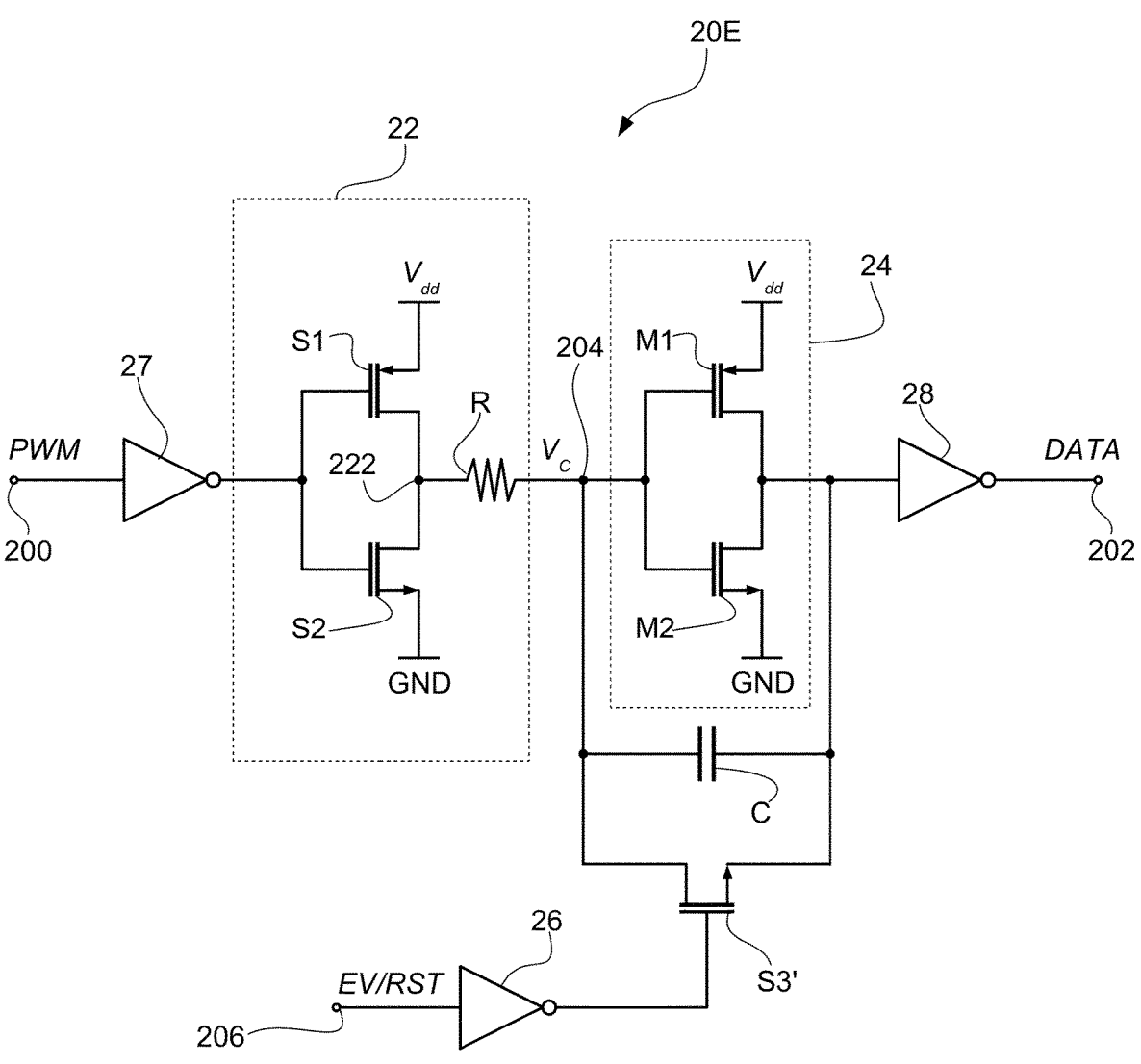
FIG. 2E is a circuit block diagram exemplary of a PWM decoder circuit according to another embodiment of the present description.

FIG. 2E is a circuit block diagram exemplary of another embodiment of a PWM decoder circuit 20E operating as discussed with reference to FIGS. 1A and 1B. As anticipated, parts or elements already disclosed with reference to the circuits 20A, 20B, 20C, 20D of FIGS. 2A, 2B, 2C, 2D are indicated with like references/numerals. In particular, the embodiment of FIG. 2E will be described mainly by indicating the differences with respect to the embodiment of FIG. 2D, while avoiding unnecessary repetitions for the sake of brevity only.

As exemplified in FIG. 2E, the capacitance C which is alternatively charged and discharged via the current generating circuitry 22 may have a first terminal coupled to the intermediate node 204 and a second terminal coupled to the output node 202 (e.g., via the inverting buffer stage 28) instead of the ground voltage node GND, resorting to a so-called Miller configuration.

Additionally, an inverting stage 27 may be included in the propagation path of the input signal PWM between the input node 200 and the controlling node of the current generating circuitry 22. The capacitance C being arranged in a Miller configuration, combined with the inverting input and output stages 27 and 28, determines an operation of the PWM decoder circuit 20E in accordance with the general operating principle disclosed herein.

In a PWM decoder circuit 20E as exemplified in FIG. 2E, the accuracy of operation may depend on the offset of the inverter comparator M1, M2 (since the charge/discharge currents of the capacitance C are identical only if the reset value of the voltage $V_C$ is equal to $V_{dd}/2$) and on the (high) speed of the inverter comparator M1, M2. Advantageously, the accuracy of operation may be independent from any matching issue of the current sources and any matching issue of capacitors, insofar as a single resistor R is used as current source (in combination with switches S1, S2) and a single capacitor C is used.

Those of skill in the art will understand that the various embodiments of PWM decoder circuits as exemplified in FIGS. 2A to 2E operate according to the operating principle discussed with reference to FIGS. 1A and 1B, and they all operate as "two-cycle PWM decoders". Each two-cycle PWM decoder circuit operates by resetting the control voltage $V_C$ during a certain PWM cycle, and evaluating the PWM duty-cycle during the next PWM cycle.

Figure 3:
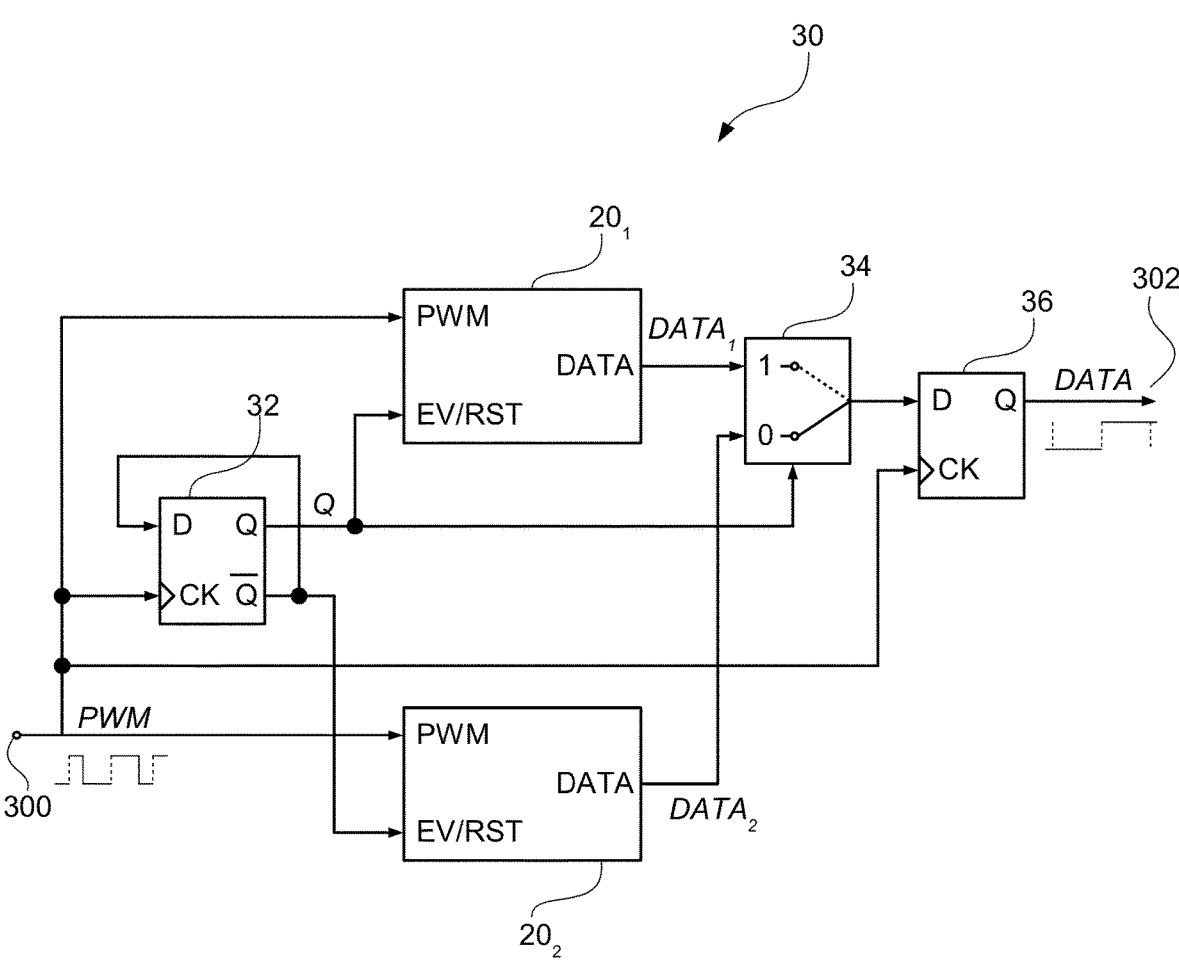
FIG. 3 is a circuit block diagram exemplary of a PWM decoder device according to one or more embodiments of the present description.

Therefore, one or more embodiments of the instant disclosure may relate to a device comprising two PWM decoder circuits which operate with a relative time shift of one PWM cycle, as exemplified in FIG. 3, so as to decode information contained in all the cycles of the input PWM signal.

FIG. 3 is a circuit block diagram exemplary of a "one-cycle PWM decoder" device 30 which comprises a first PWM decoder circuit $20_1$ and a second PWM decoder circuit $20_1$ according to one or more embodiments. The PWM decoder device 30 further comprises a control circuit 32 and a multiplexer circuit 34.

As exemplified in FIG. 3, the input node of the first PWM decoder circuit $20_1$ and the input node of the second PWM decoder circuit $20_2$ are coupled to a common input node 300 of the device 30 to receive a common input pulse width modulated signal PWM. The control circuit 32 is configured to drive the first PWM decoder circuit $20_1$ and the second PWM decoder circuit $20_2$ so that they evaluate the duty-cycle of the common input signal PWM during complementary time intervals. Each of the complementary time intervals corresponds to a period of the common input signal.

For instance, the control circuit 32 may comprise a D flip flop having a clock input coupled to the input node 300 to receive the input signal PWM, a data output Q coupled to the control input of the first PWM decoder circuit $20_1$, an inverted data output $\overline{Q}$ coupled to the control input of the second PWM decoder circuit $20_2$, and a data input D coupled to the inverted data output $\overline{Q}$.

As exemplified in FIG. 3, the multiplexer circuit 34 may be configured to propagate to a common output node 302 of the device 30 the output signal $DATA_1$ of the first decoder circuit $20_1$ or the output signal $DATA_2$ of the second decoder circuit $20_1$ alternatively at each PWM period (e.g., at the end of each PWM evaluation cycle) during which the corresponding decoder circuit evaluates the duty-cycle of the common signal PWM. For instance, the multiplexer 34 may propagate the signal $DATA_1$ when the control signal Q is equal to 1, and the signal $DATA_2$ when the control signal Q is equal to 0.

As exemplified in FIG. 3, the PWM decoder device 30 may comprise a further D flip flop 36 clocked by the input signal PWM and configured to propagate the output signal from the multiplexer 34 to the common output node 302, thereby providing for the output signal DATA being correctly sampled at the edges of the input signal PWM (i.e., at the end of each PWM period, when the signals $DATA_1$ and $DATA_2$ correctly indicate the binary value encoded by the input signal PWM).

One or more embodiments of the present disclosure may relate to corresponding methods of operation of a PWM decoder circuit or a PWM decoder device according to one or more embodiments.

As exemplified herein, a method of operating a circuit according to one or more embodiments may comprise:

receiving an input pulse width modulated signal at the input node of the circuit, the input pulse width modulated signal switching between a respective first value and a respective second value;

providing an output signal at the output node of the circuit, the output signal switching between a respective first value and a respective second value as a function of the duty-cycle of the input pulse width modulated signal;

injecting a current into the intermediate node of the circuit or sinking a current from the intermediate node of the circuit as a function of the value of the input pulse width modulated signal, thereby alternatively charging and discharging the capacitance of the circuit;

sensing a voltage signal at the intermediate node of the circuit;

comparing the sensed voltage signal to a reference voltage signal; and driving the output node of the circuit to the respective first value or to the respective second value as a function of the comparison to generate the output signal.

As exemplified herein, a method of operating a device according to one or more embodiments may comprise:

receiving a common input pulse width modulated signal at the common input node of the device;

driving the first decoder circuit and the second decoder circuit of the device to evaluate the duty-cycle of the common input pulse width modulated signal during complementary time intervals, each of the complementary time intervals corresponding to a period of the common input pulse width modulated signal, to generate the respective output signals; and propagating to the common output node of the device the output signal of the first decoder circuit or the output signal of the second decoder circuit alternatively at each of the complementary time intervals during which the corresponding decoder circuit evaluates the duty-cycle of the common input pulse width modulated signal.

Those of skill in the art will understand that one or more of the features disclosed herein with reference to a specific embodiment may be combined suitably with other feature(s) disclosed with reference to other embodiments without departing from the scope of the present invention.

For instance, a current generating circuitry 22 as exemplified in FIG. 2D may be provided in a PWM decoder circuit as exemplified in any of FIGS. 2A, 2B and 2C. As another example, a Miller configuration as exemplified in FIG. 2E may be provided in a PWM decoder circuit as exemplified in any of FIGS. 2B, 2C and 2D.

One or more embodiments as disclosed herein may thus provide one or more of the following advantages in the field of fast PWM decoding:

decoding of a PWM signal with cycles as short as 5 ns with one cycle of maximum delay, possibly implemented in a 160 nm CMOS technology;

increase of the comparison speed by resorting to an inverter arrangement M1, M2 with comparator functionality;

increase of the charge/discharge speed of the capacitance C by resorting to a resistor R with current generator functionality; and possibility of providing a single communication channel with signal bandwidth from DC up to, e.g., 150 Mbit/s in a SiC driver circuit.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is determined by the annexed claims.

The invention claimed is:

1. A method, comprising:

receiving a control signal having a first control value indicative of a reset phase and a second control value indicative of a duty cycle evaluation phase;

coupling an intermediate node to a data demodulation output node in response to the first control value of the control signal;

decoupling the intermediate node from the data demodulation output node in response to the second control value of the control signal; and while the control signal has the second control value:

injecting a current into the intermediate node as a function of a first value of an input pulse width modulated (PWM) signal in a PWM period and sinking a current from the intermediate node as a function of a second value of that input PWM signal in the same PWM period, thereby changing the voltage across the capacitor;

comparing the changing voltage to a reference voltage; and driving the data demodulation output node to generate a data demodulation output signal having a first output value or to a second output value in response to a result of said comparing.

2. The method of claim 1, further comprising alternating between the first and second control values for the control signal.

3. The method of claim 1, wherein comparing comprises applying the changing voltage to an input of an inverter circuit.

4. The method of claim 3, wherein the reference voltage is approximately one-half a supply voltage of the inverter circuit.

5. The method of claim 1, wherein comparing comprises applying the changing voltage to a first input of a differential comparison circuit and applying the reference voltage to a second input of the differential comparison circuit.

6. The method of claim 1, wherein said capacitor is coupled between the intermediate node and the output node.

7. The method of claim 6, wherein coupling the intermediate node to the data demodulation output node comprising connecting the intermediate node to the data demodulation output node by way of a transistor switch that is actuated in response to the first control value of the control signal.

8. The method of claim 1, wherein said capacitor is coupled between the intermediate node and a ground node.

9. The method of claim 8, wherein coupling the intermediate node to the data demodulation output node comprising connecting the intermediate node to the data demodulation output node by way of a transistor switch that is actuated in response to the first control value of the control signal.

10. The method of claim 1:

wherein injecting the current into the intermediate node comprises actuating a current source to source said current to the intermediate node in response to the first value of the input PWM signal; and wherein sinking the current from the intermediate node comprises actuating a current source to sink said current from the intermediate node in response to the second value of the input PWM signal.

11. The method of claim 1, further comprising latching the first or second output value at an end of the duty cycle evaluation phase.

12. The method of claim 1, further comprising:

inverting the input PWM signal; and inverting the data demodulation output signal.

13. A method, comprising:

receiving an input pulse width modulated (PWM) signal at an input node;

generating a control signal having an alternating first control value and second control value;

operating a first decoder circuit that receives the input PWM signal in a reset phase when the control signal has the first control value and in a duty-cycle evaluation phase when the control signal has the second control value;

operating a second decoder circuit that receives the input PWM signal in the reset phase when the control signal has the second control value and in the duty-cycle evaluation phase when the control signal has the first control value; and propagating to an output node an output signal of the first decoder circuit when the control signal has the second control value and propagating to the output node an output signal of the second decoder circuit when the control signal has the first control value.

14. The method of claim 13, further comprising latching a signal at the output node in response to an edge of the input PWM signal.

15. The method of claim 13, wherein said reset phase for each of the first and second decoder circuits comprises resetting a voltage across a capacitor to a reset voltage level.

16. The method of claim 15, wherein said duty-cycle evaluation phase for each of the first and second decoder circuits comprises:

injecting a current into the capacitor as a function of a first value of the input PWM signal in a PWM period and sinking a current from the capacitor as a function of a second value of that input PWM signal in the same PWM period;

comparing the voltage across the capacitor to a reference voltage; and generating the output signal having a first output value or a second output value as a function of a result of said comparing.

* * * * *